US010814597B2

(12) United States Patent
Cong et al.

(10) Patent No.: US 10,814,597 B2
(45) Date of Patent: *Oct. 27, 2020

(54) METHOD FOR PREPARING SUSPENDED TWO-DIMENSIONAL NANOMATERIALS

(71) Applicants: Tsinghua University, Beijing (CN); HON HAI PRECISION INDUSTRY CO., LTD., New Taipei (TW)

(72) Inventors: Lin Cong, Beijing (CN); Wei Zhao, Beijing (CN); Jin Zhang, Beijing (CN); Yu-Chien Tsai, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

(*) Notice: Subject to any disclaimer, the term of this patent is extended or adjusted under 35 U.S.C. 154(b) by 49 days.

This patent is subject to a terminal disclaimer.

(21) Appl. No.: 16/252,701

(22) Filed: Jan. 20, 2019

(65) Prior Publication Data
US 2019/0232631 A1    Aug. 1, 2019

(30) Foreign Application Priority Data
Jan. 27, 2018    (CN) .......................... 2018 1 0080247

(51) Int. Cl.
*B32B 37/00* (2006.01)
*B82Y 40/00* (2011.01)
(Continued)

(52) U.S. Cl.
CPC ............ *B32B 37/025* (2013.01); *B32B 3/266* (2013.01); *B32B 7/12* (2013.01); *B32B 9/041* (2013.01); *B82Y 40/00* (2013.01)

(58) Field of Classification Search
CPC combination set(s) only.
See application file for complete search history.

(56) References Cited

U.S. PATENT DOCUMENTS 8,173,525 B2 * 5/2012 Graham, Jr. ........... B82Y 40/00
                                                    438/496
9,630,849 B2 * 4/2017 Wei ....................... C01B 32/168
(Continued)

FOREIGN PATENT DOCUMENTS

CN         102315058         1/2012
CN         102737935         10/2012
(Continued)

*Primary Examiner* — Sing P Chan
(74) *Attorney, Agent, or Firm* — ScienBiziP, P.C.

(57) ABSTRACT

The present invention relates to a method for transferring two-dimensional nanomaterials. The method comprises the following steps: (S1) providing a first substrate with a two-dimensional nanomaterial layer on a surface of the first substrate; (S2) covering the two-dimensional nanomaterial layer with a carbon nanotube film structure; (S3) obtaining a composite structure comprising the two-dimensional nanomaterial layer and the carbon nanotube film structure by removing the first substrate with a corrosion solution to; (S4) placing the composite structure on a surface of a cleaning solution; (S5) providing a target substrate comprising at least one through hole, and picking up the composite structure from the cleaning solution with the target substrate by contacting the target substrate with the two-dimensional nanomaterial layer of the composite structure and covering the at least one through hole with two-dimensional nanomaterial layer; and (S6) removing the carbon nanotube film structure from the composite structure.

18 Claims, 9 Drawing Sheets

(51) Int. Cl.
  *B32B 7/12* (2006.01)
  *B32B 3/26* (2006.01)
  *B32B 9/04* (2006.01)
  *B81C 1/00* (2006.01)
  *B32B 3/00* (2006.01)
  *B82Y 30/00* (2011.01)

(56) References Cited

U.S. PATENT DOCUMENTS

| | | | | |
|---|---|---|---|---|
| 9,650,253 | B2* | 5/2017 | Wei | B82Y 40/00 |
| 9,695,045 | B2* | 7/2017 | Wei | B82Y 40/00 |
| 9,776,871 | B2* | 10/2017 | Wei | C01B 32/168 |
| 9,862,170 | B2* | 1/2018 | Wei | B32B 37/025 |
| 2008/0193678 | A1* | 8/2008 | Han | B82Y 40/00 |
| | | | | 427/598 |
| 2008/0283269 | A1* | 11/2008 | Graham, Jr. | B82Y 10/00 |
| | | | | 174/98 |
| 2010/0009165 | A1* | 1/2010 | Patel | B82Y 30/00 |
| | | | | 428/323 |
| 2010/0025222 | A1* | 2/2010 | Iijima | C01B 32/168 |
| | | | | 204/157.6 |
| 2012/0006784 | A1 | 1/2012 | Lin et al. | |
| 2012/0258275 | A1 | 10/2012 | Maeno | |
| 2012/0261588 | A1 | 10/2012 | Wei et al. | |
| 2012/0298289 | A1 | 11/2012 | Jiang et al. | |
| 2013/0264193 | A1 | 10/2013 | Lin et al. | |
| 2016/0042912 | A1 | 2/2016 | Adiga et al. | |
| 2019/0232630 | A1* | 8/2019 | Cong | B32B 3/266 |
| 2019/0232631 | A1* | 8/2019 | Cong | B81C 1/00373 |
| 2019/0232632 | A1* | 8/2019 | Cong | B32B 7/12 |

FOREIGN PATENT DOCUMENTS

| | | |
|---|---|---|
| CN | 103359723 | 10/2013 |
| CN | 103746072 | 4/2014 |
| CN | 206163454 | 5/2017 |
| CN | 206163454 U | 5/2017 |
| JP | 2011-132074 | 7/2011 |
| TW | I427000 | 2/2014 |
| TW | I520901 | 2/2016 |
| WO | 2014/064057 | 5/2014 |

* cited by examiner

A—front view

B—side view

METHOD FOR PREPARING SUSPENDED TWO-DIMENSIONAL NANOMATERIALS

CROSS-REFERENCE TO RELATED APPLICATIONS

This application claims all benefits accruing under 35 U.S.C. § 119 from China Patent Application No. 201810080247.7, filed on Jan. 27, 2018, in the China National Intellectual Property Administration, the contents of which are hereby incorporated by reference. This application is related to applications entitled, "METHOD FOR TRANSFERRING TWO-DIMENSIONAL NANOMATERIALS", filed Jan. 20, 2019, Ser. No. 16/252,700, "TRANSMISSION ELECTRON MICROSCOPE MICRO-GRID AND METHOD FOR MAKING THE SAME", filed Jan. 20 2019, Ser. No. 16/252,702, "METHOD FOR TRANSFERRING TWO-DIMENSIONAL NANOMATERIALS", filed Jan. 20, 2019, Ser. No. 16/252,703.

FIELD

The present disclosure relates to a method for preparing suspended two-dimensional nanomaterials.

BACKGROUND

Two-dimensional nanomaterials, such as graphene, boron nitride, molybdenum disulfide, etc., have become a hotspot in chemistry, materials science, and physics because of their excellent properties. Two-dimensional nanomaterials have broad application in many fields such as information technology, semiconductor, biosensor, energy and environmental protection. Wherein, it has been always a research focus for scientists in related fields to prepare high quality suspended two-dimensional nanomaterials.

At present, there are two methods for preparing suspended two-dimensional nanomaterials: a method of transfer and a method of etching. Wherein, the method of transfer uses a polymer such as polymethylmethacrylate (PMMA) as a transfer medium. The two-dimensional nanomaterials are transferred on a perforated substrate to form a suspended functional area. However, the polymer placed on a surface of the two-dimensional nanomaterials is not easily removed, and residual polymer would seriously pollute two-dimensional nanomaterials, which can affect performance characterization and device preparation. The method of etching is to etch a growth substrate of the two-dimensional nanomaterials to form a plurality of through holes in the growth substrate. Thus the method of etching does not need to transfer the two-dimensional nanomaterials. However, a chemical pollution generated by the method of etching would affect the performance of the two-dimensional nanomaterials.

What is needed, therefore, is to provide a method for preparing high quality suspended two-dimensional nanomaterials, to solve the problems discussed above.

BRIEF DESCRIPTION OF THE DRAWINGS

Many aspects of the exemplary embodiments can be better understood with reference to the following drawings. The components in the drawings are not necessarily drawn to scale, the emphasis instead being placed upon clearly illustrating the principles of the exemplary embodiments. Moreover, in the drawings, like reference numerals designate corresponding parts throughout the several views.

DETAILED DESCRIPTION

The disclosure is illustrated by way of embodiments and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "include," when utilized, means "include, but not necessarily limited to"; it specifically indicates open-ended inclusion or membership in the so-described combination, group, series, and the like.

Figure 1:
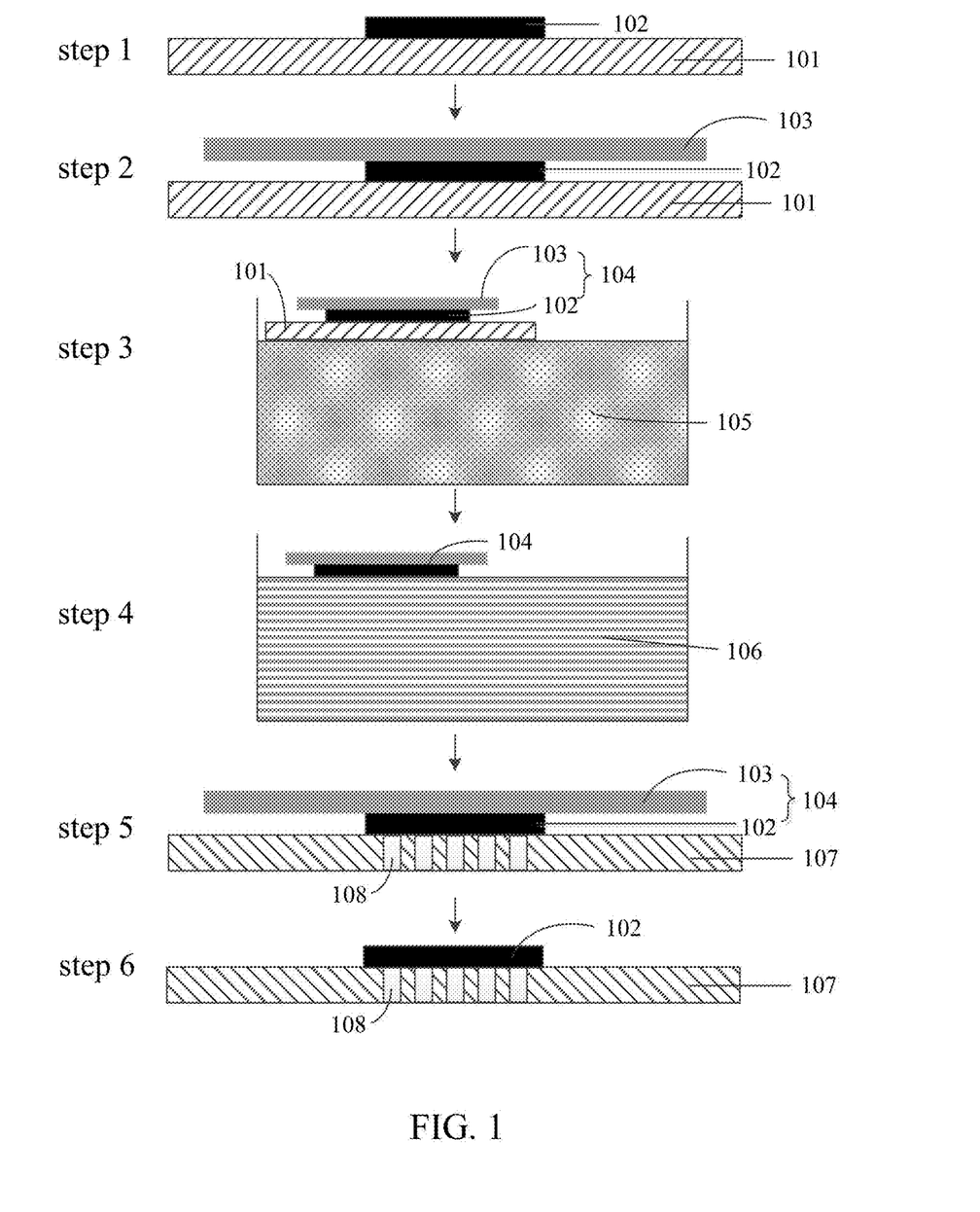
FIG. 1 shows a flow chart of a method for preparing suspended two-dimensional nanomaterials according to one embodiment.

Referring to FIG. 1, a method for preparing suspended two-dimensional nanomaterials according to one embodiment, comprises the following steps:

S1, providing a first substrate 101 with a two-dimensional nanomaterial layer 102 on a surface of the first substrate 101;

S2, covering the two-dimensional nanomaterial layer 102 with a carbon nanotube film structure 103;

S3, obtaining a composite structure 104 comprising the two-dimensional nanomaterial layer 102 and the carbon nanotube film structure 103 by removing the first substrate 101 with a corrosion solution 105;

S4, cleaning the composite structure 104 by placing the composite structure 104 on a surface of a cleaning solution 106;

S5, providing a target substrate 107 comprising at least one through hole 108, and picking up the composite structure 104 from the cleaning solution 106 with the target substrate 107 by contacting the target substrate 107 with the two-dimensional nanomaterial layer 102 of the composite structure 104 and covering the at least one through hole 108 of the target substrate 107 with the two-dimensional nanomaterial layer 102;

S6, removing the carbon nanotube film structure 103 from the composite structure 104.

The step S1~S6 are described in detail as followings.

In the step S1, a first substrate 101 is provided and a two-dimensional nanomaterial layer 102 is placed on a surface of the first substrate 101.

The first substrate 101 serves as a support for the two-dimensional nanomaterial. The first substrate 101 has a certain stability and can be removed by chemical methods or physical methods. A material of the first substrate 101 can be a semiconductor material or a metal material according to different applications. In one embodiment, the first substrate 101 can be a silicon wafer, a copper foil, a nickel foil or a copper-nickel alloy.

The two-dimensional nanomaterial layer 102 can be formed on the surface of the first substrate 101 via a chemical vapor deposition method. A material of the two-dimensional nanomaterial layer 102 can be a graphene, a boron nitride, a molybdenum sulfide, or other two-dimensional materials. A layer number of the two-dimensional nanomaterial layer 102 is not limited. The layer number of the two-dimensional nanomaterial layer 102 can be one layer, two layers or multiple layers.

Figure 2:
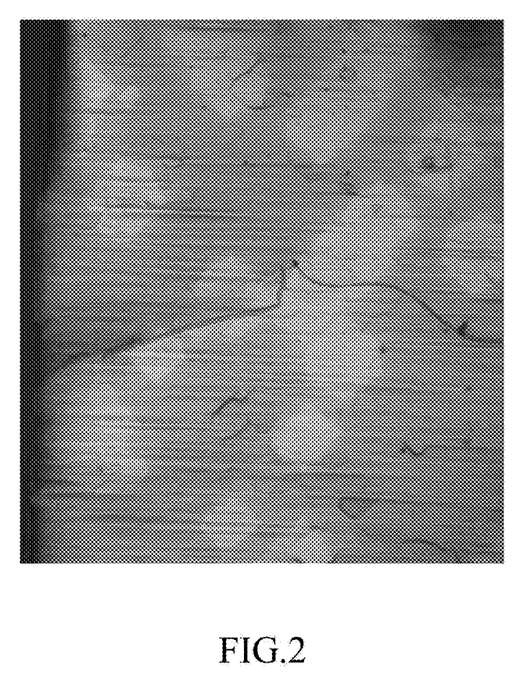
FIG. 2 shows an Optical Microscope image of a single-layer graphene grown on a surface of a copper foil according to one embodiment.

In one embodiment, the first substrate 101 is a copper foil, and the two-dimensional nanomaterial layer is a single-layer graphene directly grown on a surface of the copper foil. Referring to FIG. 2, an Optical Microscope image of the single-layer graphene grown on the surface of the copper foil is provided.

In the step S2, the two-dimensional nanomaterial layer 102 is covered with a carbon nanotube film structure 103.

The carbon nanotube film structure 103 is a free-standing structure. The carbon nanotube film structure 103 consists of at least two stacked carbon nanotube films. Understandably, the more layers of the carbon nanotube film, the weaker the light transmittance and the lower the transparency of the carbon nanotube film structure 103. In one embodiment, the carbon nanotube film structure 103 consists of two stacked carbon nanotube films. The carbon nanotube film comprises a plurality of carbon nanotubes joined end-to-end by van der Waals force therebetween and arranged approximately along a same direction. An extending direction of each carbon nanotubes is substantially parallel to a surface of the carbon nanotube film. Within the carbon nanotube film structure, the extending directions of carbon nanotubes in different carbon nanotube films can be crossed with each other to form an angle a therebetween. The angle a can be in a range from about 0 degrees to about 90 degrees.

The carbon nanotube film can be drawn directly from a carbon nanotube array, which comprises the following steps:

S21, providing a super-aligned carbon nanotube array grown on a surface of a growth substrate.

The carbon nanotube array can be formed by a chemical vapor deposition (CVD) method. The carbon nanotube array comprises a plurality of carbon nanotubes parallel to each other and approximately perpendicular to the growth substrate. The carbon nanotube array contains no impurities substantially such as amorphous carbon or residual catalyst metal particles, and is suitable for drawing a carbon nanotube film therefrom.

S22, pulling/drawing out a carbon nanotube film from the carbon nanotube array with a tool.

The step S22 comprises the following steps:

S221, selecting a carbon nanotube segment having a predetermined width from the carbon nanotube array; and S222, pulling the carbon nanotube segment at an even and uniform speed to obtain the uniform drawn carbon nanotube film.

In step S221, the carbon nanotube segment having a predetermined width can be selected by using an adhesive tape having a predetermined width to contact the carbon nanotube array. The carbon nanotube segment comprises a plurality of carbon nanotubes parallel to each other. In step S222, the pulling direction is substantially perpendicular to a growth direction of the carbon nanotube array.

Figure 3:
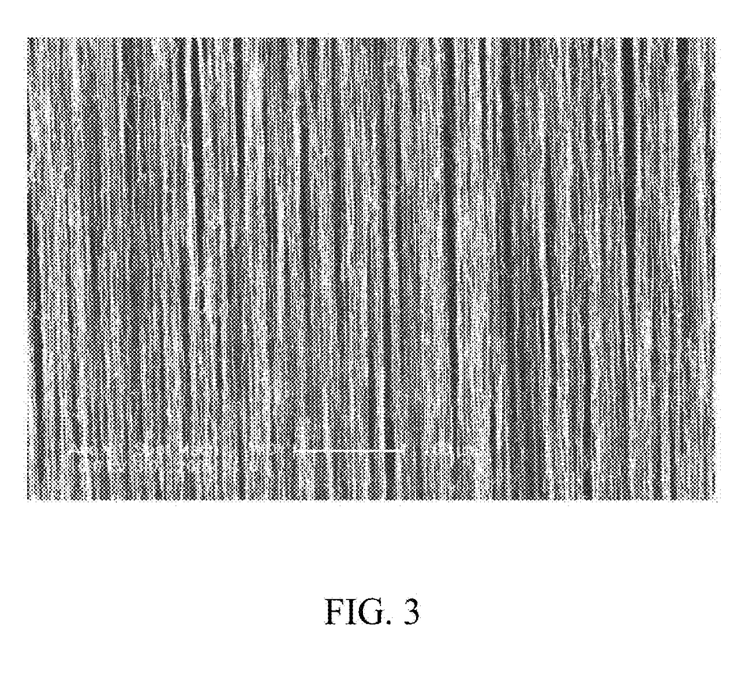
FIG. 3 shows a Scanning Electron Microscope (SEM) image of a carbon nanotube film.

More specifically, during the pulling process, as the initial carbon nanotube segment is drawn out, other carbon nanotube segments are subsequently drawn out end-to-end due to the van der Waals force between the ends of the adjacent segments. This process of drawing ensures that a continuous, uniform carbon nanotube film having a predetermined width can be formed. Referring to FIG. 3, The carbon nanotubes in the carbon nanotube film are joined end-to-end by van der Waals force therebetween to form a free-standing film. 'Free-standing' therein is defined so that the carbon nanotube film does not need support from a substrate and can sustain its own weight when it is hoisted by a portion thereof without tearing. The carbon nanotube film comprises a plurality of carbon nanotubes joined end-to-end by van der Waals force therebetween and arranged approximately along a same direction. The plurality of carbon nanotubes are arranged approximately along the drawing direction.

Figure 4:
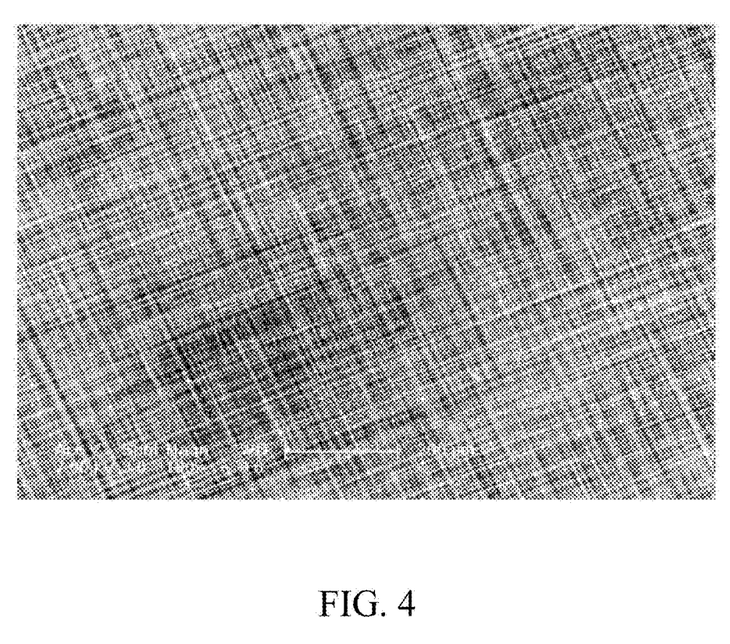
FIG. 4 shows a SEM image of a carbon nanotube film structure comprising a plurality of stacked carbon nanotube films.
Figure 5:
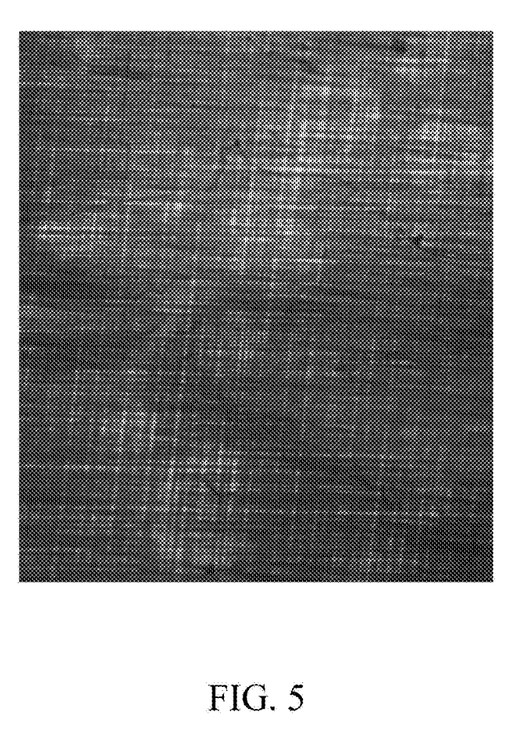
FIG. 5 shows an Optical Microscope image of a composite structure formed by covering a single-layer graphene grown on a surface of a copper foil with a carbon nanotube film structure according to one embodiment.

Referring to FIG. 4, then, at least two carbon nanotube films are stacked with each other along different directions, and the carbon nanotube film structure 103 is formed. The process above specifically comprises: providing a frame and securing a first carbon nanotube film to the frame along a first direction, wherein one or more edges of the carbon nanotube film are attached to the frame and other parts of the carbon nanotube film are suspended over the frame; placing a second carbon nanotube film on a surface of the first carbon nanotube film along a second direction. More carbon nanotube films can be stacked with each other on the frame by repeating the above process. The carbon nanotube films can be respectively arranged along different directions, and can also be arranged along two directions.

The carbon nanotube film has an extremely large specific surface area, and is self-adhesive, so adjacent carbon nanotube films can be combined with the van der Waals force therebetween to form a stable carbon nanotube film structure.

The carbon nanotube film structure 103 is placed on a surface of the two-dimensional nanomaterial layer 102 away from the first substrate 101. The carbon nanotube film structure 103 can adhere to the two-dimensional nanomaterial layer 102 firmly by van der Waals force to form a first substrate/two-dimensional nanomaterial layer/carbon nanotube film composite structure.

Step S2 can further comprise an optional step of treating the carbon nanotube film structure 103 on the two-dimensional nanomaterial layer 102 of the first substrate 101 with an organic solvent. The organic solvent can be volatile at room temperature and can be ethanol, methanol, acetone, dichloroethane, chloroform, or any combination thereof. The step of treating the carbon nanotube film structure 103 with the organic solvent comprises: dropping the organic solvent on a surface of the carbon nanotube film structure 103 uniformly and infiltrating the whole carbon nanotube structure 103 with the organic solvent, or, alternatively, immersing the entire carbon nanotube film structure 103 on the two-dimensional nanomaterial layer 102 of the first substrate 101 into a container containing the organic solvent.

The organic solvent can be evaporated from the surface of the carbon nanotube film structure 103. Thereby pores between adjacent carbon nanotubes in the carbon nanotube film structure 103 can be enlarged, and the carbon nanotube film structure 103 can adhere to the two-dimensional nanomaterial layer 102 more firmly by the surface tension of the solvent, in addition to the self-adhering van der Waals force.

In one embodiment, the carbon nanotube film structure comprises two carbon nanotube films stacked with each other. An angle formed by the extending directions of the carbon nanotubes in the two carbon nanotube films is 90 degrees. The carbon nanotube film structure 103 is placed on a surface of the single-layer graphene grown on the surface of the copper foil. Then, the ethanol is dropped on a surface of the carbon nanotube film structure 103 to increase a bonding force between the carbon nanotube film structure 103 and the single-layer graphene by an effect of a surface tension of the ethanol. FIG. 3 shows an Optical Microscope image of the composite structure formed by covering the single-layer graphene grown on the surface of the copper foil with the carbon nanotube film structure. Referring to FIG. 3, the carbon nanotube film structure is of certain transparency, and thus the single-layer graphene can be observed through the carbon nanotube film structure.

In the step S3, the first substrate 101 is removed with a corrosion solution 105, thus a composite structure 104 comprising the two-dimensional nanomaterial layer 102 and the carbon nanotube film structure 103 can be obtained.

The first substrate/two-dimensional nanomaterial layer/carbon nanotube film structure composite structure is placed on a surface of a corrosion solution 105 filled in a container. The first substrate 101 is in contact with the corrosion solution 105. The corrosion solution 105 can react with the first substrate 101 and will not erode the two-dimensional nanomaterial layer 102 and the carbon nanotube film composite structure 103. Thus, after reacting with the corrosion solution 105 for a period of time, the first substrate 101 can be removed.

Different corrosion solution can be selected according to the material of the first substrate 101. The corrosion solution 105 can be an acid solution, an alkali solution, or a salt solution. For example, the corrosion solution 105 can be a ferric chloride solution, an ammonium persulfate solution, or a potassium hydroxide solution. A corroding time required for the first substrate 101 depends on a size and a thickness of the first substrate 101 and a concentration and a type of the corrosion solution 105. In one embodiment, the corrosion solution 105 is the ammonium persulfate solution, the concentration of the ammonium persulfate solution is 0.1 mol/L, and the corroding time is about 2 hours to 3 hours.

During the corroding process, the carbon nanotube film structure 103 can float on the surface of the corrosion solution 105 because carbon nanotube films are hydrophobic. The two-dimensional nanomaterial layer 102 can adhere to the surface of the carbon nanotube film structure 103 tightly via the van der Waals force therebetween. Moreover, as a free-standing structure, the carbon nanotube film structure 103 can act as a carrier for supporting the two-dimensional nanomaterial layer 102, and can also prevent the continuous integrated structure of the two-dimensional nanomaterial layer 102 from disintegrating.

In the step S4, the composite structure 104 comprising the two-dimensional nanomaterial layer 102 and the carbon nanotube film structure 103 is placed on a surface of a cleaning solution 106 for cleaning.

In the corroding process of the step S3, solid impurities can be formed on a surface of the two-dimensional nanomaterial layer 102. The composite structure 104 comprising the two-dimensional nanomaterial layer 102 and the carbon nanotube film structure 103 can be further cleaned by a cleaning solution 106 to remove the solid impurities. In one embodiment, the cleaning process comprises the followings steps:

S41, picking up the composite structure 104 comprising the two-dimensional nanomaterial layer 102 and the carbon nanotube film structure 103 from the corrosion solution 105 with a slide glass;

S42, transferring the composite structure 104 comprising the two-dimensional nanomaterial layer 102 and the carbon nanotube film structure 103 to the surface of the cleaning solution 106 with the slide glass and rinsing off the solid impurities.

The steps above can be repeated many times until the solid impurities are removed completely. The cleaning solution 106 can be an acid solution or an ultra-pure water. In one embodiment, the cleaning solution 106 is the ultra-pure water.

In the step S5, a target substrate 107 comprising at least one through hole 108 is provided and the composite structure 104 comprising the two-dimensional nanomaterial layer 102 and the carbon nanotube film structure 103 is picked up from the cleaning solution with the target substrate 107, wherein the two-dimensional nanomaterial layer 102 is in contact with the target substrate 107 and covers the at least one through hole 108.

The target substrate 104 serves as a support for the two-dimensional nanomaterial layer 102. A material of the target substrate 104 is not limited. The material of the target substrate 104 can be metal material such as gold, aluminum, nickel, chromium, copper, semiconductor material such as silicon, gallium nitride, gallium arsenide, or insulating material such as silicon dioxide, silicon nitride. A length, a width and a thickness of the target substrate 104 are not limited and can be adjusted according to applications. A surface of the target substrate 104 can be a flat surface or a curved surface.

The target substrate 107 defines at least one through hole 108. The through hole 108 can be formed by etching the target substrate 107. A diameter of the through hole 108 ranges from about 0.1 microns to about 100 microns, and in one embodiment, the diameter of the through hole 107 ranges from about 0.5 microns to about 50 microns. A cross-sectional shape of the through hole 108 can be a circle, a quadrangle, a hexagon, an octagon or an ellipse etc. When the target substrate 107 comprises a plurality of through holes 108, an arrangement of the plurality of through holes 108 on the target substrate 104 are not limited. A distance between adjacent through holes 108 can be equal or unequal.

In one embodiment, the plurality of the through holes 108 are evenly distributed in the target substrate 107.

Figure 6:
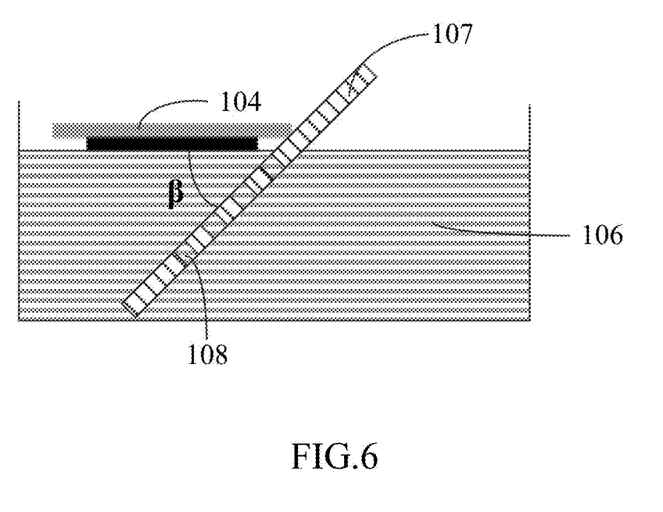
FIG. 6 shows a sketch of inserting a target substrate into a cleaning solution to picking up a composite structure comprising a two-dimensional nanomaterial layer and a carbon nanotube film structure.

In one embodiment, the process of picking the composite structure 104 up from the cleaning solution 106 with the target substrate 107 comprises: S51, inserting the target substrate 107 into the cleaning solution 106; S52, lifting the target substrate 107 slowly to pick up the composite structure 104 comprising the two-dimensional nanomaterial layer 102 and the carbon nanotube film structure 103.

Referring to FIG. 6, in the step S51, a manner of inserting the target substrate 107 into the cleaning solution is not limited. In one embodiment, the target substrate 107 can be obliquely or vertically inserted into the cleaning solution 106 along one edge of the composite structure 104, and a surface of the target substrate 107 is in contact with an edge of the composite structure 104. 'obliquely' implies that n angle β can be defined between the target substrate 107 and the composite structure 104. The angle β can range from about 0 degree to about 90 degrees. 'Vertically' implies that the target substrate 107 is vertical to the composite structure 104 and the angle β is 90 degrees. In another embodiment, the target substrate 107 is inserted into the cleaning solution 106 and substantially parallel to the composite structure 104 in the cleaning solution 106, and the angle β is 0 degrees.

In the step S52, the target substrate 107 is lift slowly. During the process of lifting the target substrate 107, the composite structure 104 is picked up from the cleaning solution 105, and a surface of the target substrate 107 is in contact with and adhere to the two-dimensional nanomaterial layer 102. Thus, the two-dimensional nanomaterial layer 102 are sandwiched between the carbon nanotube film structure 103 and the target substrate 107.

After being picked up, the target substrate 107 and the composite structure 104 can be dried. Thereby, the two-dimensional nanomaterial layer 102 can adhere to the target substrate 107 tightly.

In the present disclosure, the composite structure 104 comprising the two-dimensional nanomaterial layer 102 and the carbon nanotube film structure 103 is picked up from the cleaning solution 106 with the target substrate 107, and then transferred on a surface of the target substrate 107. Thereby, wrinkles and cracks on the surface of the two-dimensional nanomaterial layer 102 can be reduced, and a bonding force between the two-dimensional nanomaterial 102 and the target substrate 107 can be enhanced.

The carbon nanotube film structure 103 comprises a plurality of micropores, therefore it is light transmitting and transparent. The two-dimensional nanomaterial layer 102 can be observed through the carbon nanotube film structure 103 under a stereo microscope. The at least one through hole 108 of the target substrate 107 can be precisely aligned with the two-dimensional nanomaterial layer 102 of the composite structure 104 in the cleaning solution 106 in advance, and then the composite structure 104 is picked up from the cleaning solution 106 with the target substrate 107. In this way, the two-dimensional nanomaterial layer 102 can cover the at least one through hole 108 of the target substrate 107. Thereby a site-directed transfer of the two-dimensional nanomaterial layer 102 can be realized.

In one embodiment, the target substrate 107 is a porous silicon nitride substrate, a surface of the porous silicon nitride substrate is a flat surface, and a thickness of the porous silicon nitride substrate is about 100 nanometers. The porous silicon nitride substrate defines a plurality of through holes, and a diameter of each of the through holes is about 2 micrometers.

The porous silicon nitride substrate is placed on a surface of a silicon substrate. The silicon substrate is used to support and protect the porous silicon nitride substrate. The silicon substrate comprises a window. The window is a big hole and extends through the silicon substrate along a thickness direction of the silicon substrate. The plurality of through holes of the porous silicon nitride substrate is placed above the window of the silicon substrate. A thickness of the silicon substrate ranges from about 100 to 500 micrometers, and a size of the window ranges from about 50 to 300 micrometers.

In the step S6, the carbon nanotube film structure 103 is removed from the composite structure 104.

A method for removing the carbon nanotube film structure 103 is not limited. Two methods for removing the carbon nanotube film structure 103 are provided in the following disclosure.

Figure 7:
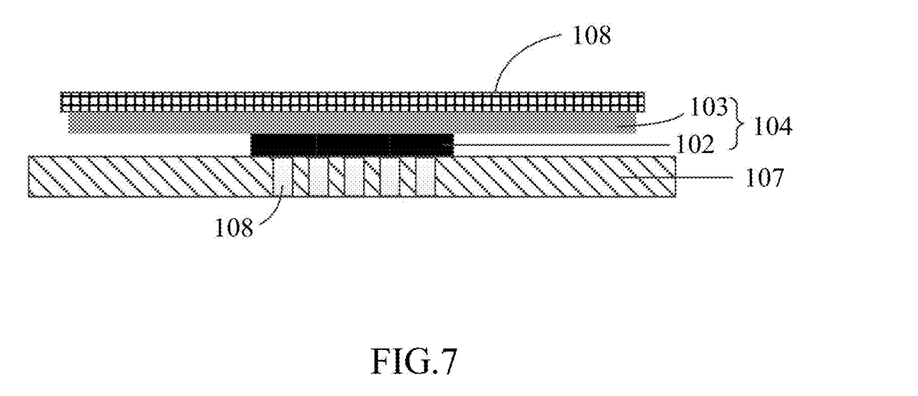
FIG. 7 shows a sketch of placing a polymer film on a surface of a carbon nanotube film structure.

A first method, in which a polymer film is used to remove the carbon nanotube film structure 103, comprises steps of:

Step (1), placing a polymer film 109 on a surface of the carbon nanotube film structure 103 away from the target substrate 107.

Referring to FIG. 7, the carbon nanotube film structure 103 is covered by the polymer film 109. The polymer film 109 can be selected from materials whose crosslinking degree become high when treated via heating or irradiation. In one embodiment, the material of the polymer film 109 can be a thermosetting material such as polymethylsiloxane (PDMS) or polybutyl acrylate (PBA). In one embodiment, the carbon nanotube film structure 103 is completely covered with the polymer film 109.

Step (2), treating the polymer film 109 by heating or by irradiation to increase its crosslinking degree.

The polymer film 109 is treated such that the carbon nanotube film structure 103 and the polymer film 109 are torn off from the two-dimensional layer together. In one embodiment, the polymer film 109 is heated at a temperature for a period of time to increase its crosslinking degree. The heating temperature and the heating time depend on the material of the polymer film 109. For example, when the polymer film 109 is a PDMS film, it is heated at 150 degrees Celsius for 20 minutes to 40 minutes. After heated, the polymer film 109 has a high crosslinking degree. At this time, the polymer film 109 becomes hard when it is heated and can be easily torn off. The polymer film 109 can only adhere with the carbon nanotube film structure 103. In addition, a binding force between the polymer film 109 and the carbon nanotube film structure 103 is greater than that between the two-dimensional nanomaterial layer 102 and the carbon nanotube film structure 103, so the carbon nanotube film structures 103 can be torn off with the polymer film 109.

Step (3), tearing off the polymer film 109 from the two-dimensional nanomaterial layer 102.

The polymer film 109 can be torn off by clamping a side of the polymer film 109 with a tool such as a tweezers, and the carbon nanotube film structure 103 is torn off with the polymer film 109, leaving the two-dimensional nanomaterial layer 102 on the surface of the target substrate 107.

Figure 8:
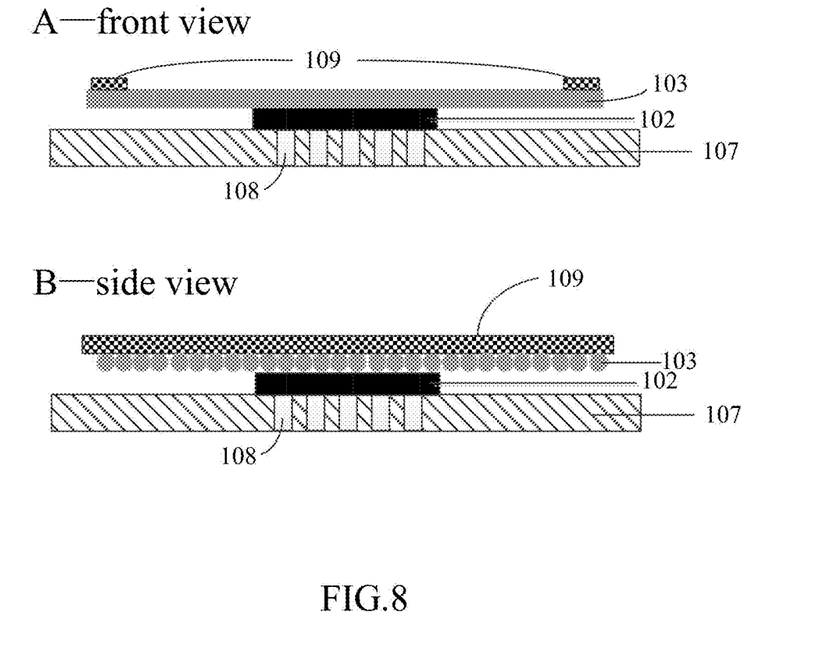
FIG. 8 shows a front view and a side view of placing at least one strip on a surface of an nth layer carbon nanotube film of a carbon nanotube film structure.

A second method, in which at least one strip is used to remove the carbon nanotube structure 103, comprises steps of:

Step (A), when the carbon nanotube film structure 103 consists of n-layer carbon nanotube films stacked with each other, wherein n is an integer greater than or equals to two, a first layer carbon nanotube film to an n−1th layer carbon nanotube film of the carbon nanotube film structure 103 are sequentially torn off along the extending directions of carbon nanotubes of the carbon nanotube film structure 103, wherein the first layer carbon nanotube film is farthest away from the two-dimensional nanomaterial layer 102.

The first layer carbon nanotube film to the n−1th layer carbon nanotube film of the carbon nanotube film structure 103 can be torn off by a tool such as a tweezer, leaving an nth layer carbon nanotube film of the carbon nanotube film structure 103 on the surface of the two-dimensional nanomaterial layer 102.

Step (B), at least one strip 110 is placed on a surface of the nth layer carbon nanotube film of the carbon nanotube film structure 103 away from the two-dimensional nanomaterial layer 102, wherein, the strip 110 is placed at one side of the nth layer carbon nanotube film, the strip 110 does not cover the two-dimensional nanomaterial layer 102, and an extending direction of the strip 109 is substantially perpendicular to the extending direction of carbon nanotubes of the nth layer carbon nanotube film.

Referring to FIG. 8, at least one strip 110 is placed on a surface of the nth layer carbon nanotube film of the carbon nanotube film structure 103. A shape of the strip 110 can be regular or irregular. In one embodiment, the shape of the strip 110 is a rectangle. The rectangle strip comprises a long side and a short side, wherein the long side is substantially perpendicular to the carbon nanotubes of the nth layer carbon nanotube film. In another embodiment, at least two strips are provided. The at least two strips are placed at two opposite sides of the nth layer carbon nanotube film. The strip 110 has a certain viscosity and thus can adhere to the nth layer carbon nanotube film. The strip 110 can be a polymer film or an adhesive tape.

Step (c), the nth layer nanotube film is torn off from the two-dimensional nanomaterial layer 102, as the strip 110 is being torn off along the extending directions of carbon nanotubes of the nth layer carbon nanotube film.

The nth layer of carbon nanotube film is a continuous film, so it can be torn off as the strip 110 is being torn off. The two-dimensional nanomaterial layer 102 is left adhered to the surface of the target substrate 107.

By the two methods above, the carbon nanotube film structure 103 can be completely removed. The two-dimensional nanomaterial layer 102 sustains no damages, and no residue is left on the surface of the two-dimensional nanomaterial layer 102.

Figure 9:
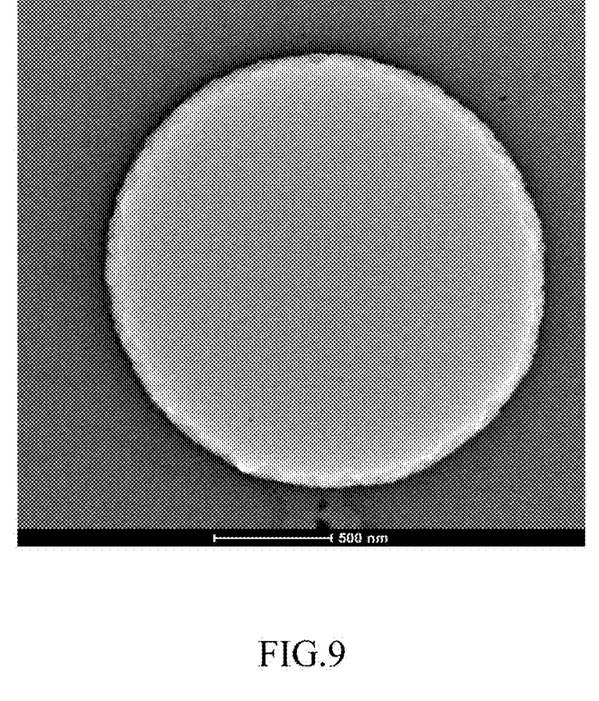
FIG. 9 shows a Transmission Electron Microscope image of a single-layer graphene after transfer according to one embodiment.

FIG. 9 shows a Transmission Electron Microscope (TEM) image of the graphene transferred on the surface of the target substrate. Referring to FIG. 8, the single-layer graphene has no damage, and there is no residue on the surface of the single-layer graphene.

In the present disclosure, the carbon nanotube film structure is used to transfer the two-dimensional nanomaterials to the surface of the target substrate comprising at least one through hole, thus suspended two-dimensional nanomaterials are prepared. The method for preparing suspended two-dimensional nanomaterials comprises the following characteristics: Firstly, no residual organic binders is left on the surface of the suspended two-dimensional nanomaterials; Secondly, no wrinkles and cracks exists on the surface of the suspended two-dimensional nanomaterials, and the suspended two-dimensional nanomaterials have a high integrity; Thirdly, the carbon nanotube film is light transmitting and high transparent, and the two-dimensional nanomaterials can be observed through the carbon nanotube film, therefore the two-dimensional nanomaterials can be transferred to a specific location of the surface of the target substrate with precision under a stereo microscope;

Fourthly, due to the flexibility of carbon nanotube film, two-dimensional nanomaterials an be transferred on a curved surface of a substrate with the carbon nanotube film structure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for preparing suspended two-dimensional nanomaterials comprising:
    (S1) providing a first substrate with a two-dimensional nanomaterial layer on a surface of the first substrate;
    (S2) covering the two-dimensional nanomaterial layer with a carbon nanotube film structure;
    (S3) obtaining a composite structure comprising the two-dimensional nanomaterial layer and the carbon nanotube film structure by removing the first substrate with a corrosion solution to;
    (S4) cleaning the composite structure by placing the composite structure on a surface of a cleaning solution;
    (S5) providing a target substrate comprising at least one through hole, and picking up the composite structure from the cleaning solution with the target substrate by contacting the target substrate with the two-dimensional nanomaterial layer of the composite structure and covering the at least one through hole with the two-dimensional nanomaterial layer; and
    (S6) removing the carbon nanotube film structure from the composite structure.

2. The method of claim 1, wherein a material of the two-dimensional nanomaterial layer is a graphene, a boron nitride, or a molybdenum sulfide.

3. The method of claim 1, wherein the carbon nanotube film structure is a free-standing structure, and the carbon nanotube film structure comprises at least two carbon nanotube films stacked with each other.

4. The method of claim 3, wherein each of the the carbon nanotube films comprises a plurality of carbon nanotubes joined end-to-end by van der Waals force therebetween and extending approximately along a same extending direction.

5. The method of claim 4, wherein the extending direction of the plurality of carbon nanotubes is substantially parallel to a surface of the carbon nanotube film.

6. The method of claim 4, wherein the extending directions of the carbon nanotubes in different carbon nanotube films are crossed with each other to form an angle a therebetween, and the angle a ranges from 0 degrees to 90 degrees.

7. The method of claim 1, wherein a diameter of the through hole of the target substrate ranges from 0.1 microns to 100 microns.

8. The method of claim 1, wherein the corrosion solution is an acid solution, an alkali solution, or a salt solution.

9. The method of claim 1, wherein the cleaning solution is an acid solution or an ultra-pure water.

10. The method of claim 1, wherein the step (S5) comprises: inserting the target substrate into the cleaning solution; and lifting the target substrate to pick up the composite structure.

11. The method of claim 1, wherein in the step (S5), after picking up the composite structure with the target substrate, the target substrate and the composite structure are dried.

12. The method of claim 1, wherein the step (S6) comprises:
   placing a polymer film on a surface of the carbon nanotube film structure away from the target substrate;
   treating the polymer film by heating or by irradiation to increase a crosslinking degree of the polymer film; and
   tearing off the polymer film from the two-dimensional nanomaterial layer.

13. The method of claim 12, wherein a material of the polymer film is a thermosetting material.

14. The method of claim 12, wherein the carbon nanotube film structure is covered with the polymer film.

15. The method of claim 12, wherein the polymer film is treated such that the carbon nanotube film structure and the polymer film are torn off from the two-dimensional nanomaterial layer together.

16. The method of claim 1, wherein the carbon nanotube film structure consists of n-layer carbon nanotube films stacked with each other, wherein n is an integer greater than or equals to two.

17. The method of claim 16, wherein the step (S6) comprises:
   tearing off a first layer carbon nanotube film to an n-lth layer carbon nanotube film of the carbon nanotube film structure sequentially along extending directions of the carbon nanotubes of the carbon nanotube films, wherein the first layer carbon nanotube film is farthest away from the two-dimensional nanomaterial layer;
   placing at least one strip on a surface of an nth layer carbon nanotube film away from the two-dimensional nanomaterial layer, wherein the strip is placed at one side of the nth layer carbon nanotube film, the strip does not cover the two-dimensional nanomaterial layer, and an extending direction of the strip is substantially perpendicular to the extending directions of the carbon nanotubes of the nth layer carbon nanotube film; and
   tearing off the nth layer carbon nanotube film from the two-dimensional nanomaterial layer as the strip is being torn off along the extending directions of carbon nanotubes.

18. The method of claim 17, wherein the strip is a polymer film or an adhesive tape.

* * * * *